US009922726B2

(12) United States Patent
Choi

(10) Patent No.: US 9,922,726 B2
(45) Date of Patent: Mar. 20, 2018

(54) SEMICONDUCTOR MEMORY DEVICE AND METHOD FOR DETECTING WEAK CELLS

(71) Applicant: SK hynix Inc., Gyeonggi-do (KR)

(72) Inventor: Young-Geun Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 98 days.

(21) Appl. No.: 15/147,419

(22) Filed: May 5, 2016

(65) Prior Publication Data

US 2017/0178751 A1 Jun. 22, 2017

(30) Foreign Application Priority Data

Dec. 16, 2015 (KR) ........................ 10-2015-0179960

(51) Int. Cl.
G11C 29/00 (2006.01)
G11C 29/50 (2006.01)
G01R 31/3181 (2006.01)

(52) U.S. Cl.
CPC .......... *G11C 29/50* (2013.01); *G01R 31/3181* (2013.01); *G11C 29/50004* (2013.01); *G06F 2201/81* (2013.01)

(58) Field of Classification Search
CPC .... G01R 31/3181; G11C 29/50; G11C 29/52; G11C 29/50004; G06F 2201/81
USPC ........................................ 714/718, 721, 763
See application file for complete search history.

(56) References Cited

U.S. PATENT DOCUMENTS

| 5,349,557 A * | 9/1994 | Yoshida .................. G11C 7/12 365/189.11 |
| 6,819,621 B2 | 11/2004 | Koelling et al. |
| 2002/0006063 A1* | 1/2002 | Sato ...................... G11O 5/145 365/189.11 |
| 2002/0018389 A1* | 2/2002 | Ito ....................... G06F 11/1008 365/222 |
| 2006/0244396 A1* | 11/2006 | Bucur .................. H05B 33/083 315/312 |
| 2008/0080279 A1* | 4/2008 | Choi ........................ G11C 7/12 365/203 |
| 2010/0142306 A1* | 6/2010 | Nakamura ............. G11O 5/145 365/227 |
| 2010/0188896 A1* | 7/2010 | Shinoda ................ G11C 29/02 365/185.2 |

(Continued)

FOREIGN PATENT DOCUMENTS

KR 1019960008282 6/1996

*Primary Examiner* — Albert Decady
*Assistant Examiner* — Osman M Alshack
(74) *Attorney, Agent, or Firm* — IP & T Group LLP

(57) ABSTRACT

A semiconductor memory device may include: a memory cell array coupled between a plurality of word lines and a plurality of bit lines; a first source voltage supply unit suitable for providing a boosted voltage to a source voltage terminal when a cell mat signal is activated; a second source voltage supply unit suitable for providing a dropped voltage that is lower than the boosted voltage to the source voltage terminal; a word line driving circuit suitable for selecting one of the plurality of word lines in response to an address combination signal and driving the selected word line and unselected word lines, when the cell mat signal is activated; and a weak cell detection circuit suitable for detecting a weak cell by checking data values of memory cells coupled to a word line which is driven by the word line driving circuit during the test mode.

12 Claims, 7 Drawing Sheets

(56) References Cited

U.S. PATENT DOCUMENTS

| | | | |
|---|---|---|---|
| 2010/0277968 A1* | 11/2010 | Tokiwa | G11C 7/1042 |
| | | | 365/148 |
| 2011/0194353 A1* | 8/2011 | Hwang | G11C 11/5628 |
| | | | 365/185.19 |
| 2011/0235457 A1* | 9/2011 | Hirata | G11O 5/145 |
| | | | 365/226 |

\* cited by examiner

SEMICONDUCTOR MEMORY DEVICE AND METHOD FOR DETECTING WEAK CELLS

CROSS-REFERENCE TO RELATED APPLICATIONS

The present application claims priority of Korean Patent Application No. 10-2015-0179960, filed on Dec. 16, 2015, which is incorporated herein by reference in its entirety.

BACKGROUND

1. Field

This patent document relates to semiconductor design technology and, more particularly, to a semiconductor memory device including a word line driving circuit and a method for detecting weak cells therein.

2. Description of the Related Art

Typically, after a semiconductor memory device is designed and fabricated, a test process at the wafer level and a test process at the package level are performed to determine whether the semiconductor memory device includes any chip fails.

During the wafer level test, a large amount of data is tested at a time through 64 or 128 parallel channels. Furthermore, since an operating frequency during the wafer level test is basically low, without considering an external noise or a noise caused by clock intervention, an external or internal voltage is lowered to perform the wafer level test.

When such a method is applied, most errors are detected. However, so-called weak cells of which one bit or several bits are dead due to charge sharing may not be detected.

Weak cells may occur as the chip density is gradually increased, the technology is more and more refined, and the operation voltage is gradually decreased. According to existing related art, since packaging is performed in a state where weak cells are not detected during the wafer level test, chip fails may still occur thus reducing the package yield.

Thus, research is being conducted on a variety of schemes for improving detection of weak cells.

SUMMARY

Various embodiments are directed to a semiconductor memory device capable of detecting and screening weak cells using a power scheme of a word line driving circuit without a separate driving circuit, to thereby perform an efficient weak cell screening operation with separate driving circuit occupying a minimum area, and a method of detecting weak cells therein.

Also, various embodiments are directed to a semiconductor memory device capable of detecting and screening weak cells using a power scheme of a word line driving circuit which supplies a boosted voltage during an active operation to the word line driving circuit and supplies a lower voltage than the boosted voltage to the word line driving circuit during a standby operation, and a method of detecting weak cells therein.

In an embodiment, a semiconductor memory device may include: a memory cell array coupled between a plurality of word lines and a plurality of bit lines; a first source voltage supply unit suitable for providing a boosted voltage to a source voltage terminal when a cell mat signal is activated; a second source voltage supply unit suitable for providing a dropped voltage that is lower than the boosted voltage to the source voltage terminal so that the dropped voltage during a test mode is lower than the dropped voltage during a normal mode; a word line driving circuit coupled between the source voltage terminal and a low voltage terminal, and suitable for selecting one of the plurality of word lines in response to an address combination signal and driving the selected word line and unselected word lines, when the cell mat signal is activated; and a weak cell detection circuit suitable for detecting a weak cell by checking data values of memory cells coupled to a word line which is driven by the word line driving circuit during the test mode.

In an embodiment, a semiconductor memory device may include: a memory cell array coupled between a plurality of word lines and a plurality of bit lines, and coupled to a cell plate node; a source voltage supply unit suitable for supply a source voltage to a source voltage terminal by providing a dropped voltage that is lower than a boosted voltage to the source voltage terminal when a cell mat signal is deactivated, and by providing the boosted voltage to the source voltage terminal when the cell mat signal is activated; a word line driving circuit coupled between the source voltage terminal and a low voltage terminal, and suitable for driving the plurality of word lines in response to the cell mat signal and an address combination signal; and a weak cell detection circuit suitable for detecting a weak cell by checking a cell plate voltage of the cell plate node during a test mode, wherein the dropped voltage during the test mode is lower than the dropped voltage during a normal mode, and an amount of noise introduced into the cell plate node from the plurality of word lines is increased when the cell match signal transits from an inactive state to an active state.

In an embodiment, a method of detecting weak cells in a semiconductor memory device may include: entering a test mode; providing a dropped voltage that is lower than a boosted voltage to a source voltage terminal when a cell mat signal is deactivated, so that the dropped voltage during a test mode is lower than the dropped voltage during a normal mode; selecting one of a plurality of word lines in response to an address combination signal, and driving the selected word line and unselected word lines, when the cell mat signal is activated; and detecting a weak cell by checking data values of memory cells coupled to the word line.

DETAILED DESCRIPTION

Figure 1:
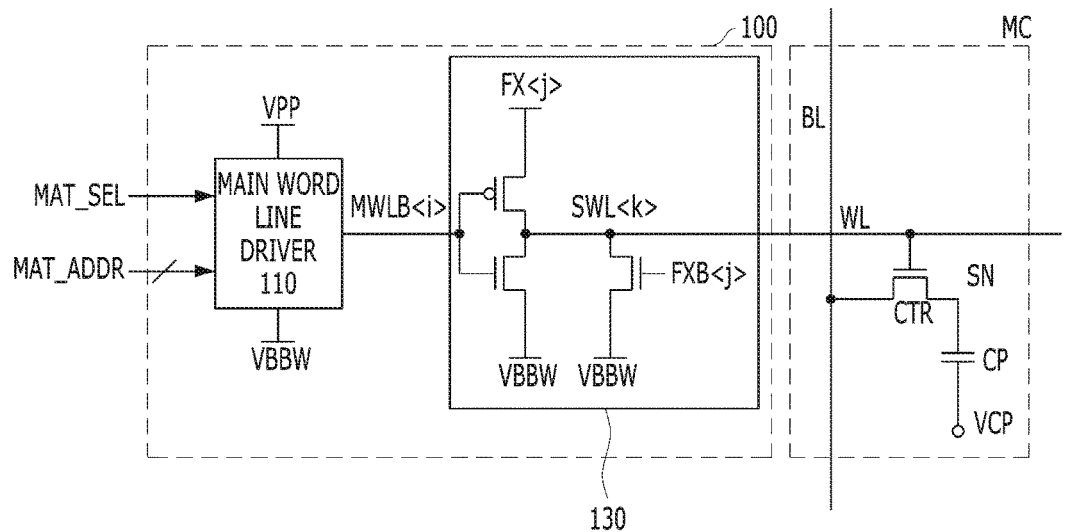
FIG. 1 is a block diagram illustrating a word line driving circuit of a semiconductor memory device.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the relevant art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. It will be understood that, although the terms "first", "second", "third", and so on may be used herein to describe various elements, components, regions, layers and/or sections, these elements, components, regions, layers and/or sections should not be limited by these terms. These terms are used to distinguish one element component, region, layer or section from another element, component, region, layer or section. Thus, a first element component, region, layer or section described below could be termed a second element, component, region, layer or section, without departing from the spirit and scope of the present disclosure. In addition, it will also be understood that when an element or layer is referred to as being "between" two elements or layers, it can be the only element or layer between the two elements or layers, or one or more intervening elements or layers may also be present.

It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or groups thereof.

The terminology used herein is for the purpose of describing particular embodiments only and is not intended to be limiting of the present disclosure. Unless otherwise defined, all terms including technical and scientific terms used herein have the same meaning as commonly understood by one of ordinary skill in the art to which this invention belongs. It will be further understood that terms such as those defined in commonly used dictionaries, should be interpreted as having a meaning that is consistent with their meaning in the context of the relevant art and will not be interpreted in an idealized or overly formal sense unless expressly so defined herein.

In the following description, numerous specific details are set forth in order to provide a thorough understanding of the present disclosure. The present disclosure may be practiced without some or all of these specific details. In other instances, well-known process structures and/or processes have not been described in detail in order not to unnecessarily obscure the present disclosure.

Hereinafter, the various embodiments of the present disclosure will be described in details with reference to attached drawings.

A semiconductor memory device may perform a basic operation that selects one of a plurality of memory cells, and stores external data in the selected memory cell or outputs data stored in the selected memory cell to an external device.

For example, a memory cell may be coupled between a word line WL and a bit line BL, which cross each other, a predetermined word line WL may be enabled by a row address, and a predetermined bit line BL may be enabled by a column address. Furthermore, data may be read from or written to the memory cell coupled between the enabled word line WL and the enabled bit line BL.

The word line WL may include a plurality of main word lines and a plurality of sub word lines which may be divided into groups, each group commonly coupled to one of the main word lines. A plurality of memory cells may be coupled to each of the sub word lines. According to a decoded row address, one or more main word lines and one or more sub word lines may be enabled. For example, each sub word line may correspond to each word line WL.

In order to drive the word lines WL, the semiconductor memory device may include a plurality of word line drivers corresponding to the number of the word lines WL.

FIG. 1 is a block diagram illustrating a word line driving circuit 100 of a semiconductor memory device. FIG. 1 illustrates the word line driving circuit 100 corresponding to one memory cell.

Referring to FIG. 1, the word line driving circuit 100 may include a main word line driver 110 and a sub word line driver 130.

The main word line driver 110 may drive a main word line MWLB<i> to a high voltage VPP or a low voltage VBBW in response to a cell mat signal MAT_SEL and an address combination signal MAT_ADDR. At this time, the high voltage VPP may be higher than a supply voltage VDD, and the low voltage VBBW may be equal to or lower than a ground voltage VSS. The sub word line driver 130 may drive a sub word line SWL<k> to the high voltage VPP or the low voltage VBBW in response to the main word line MWLB<i> and a word line select signal FX<j>. Only when the main word line MWLB<i> is enabled to the low voltage VBBW and the word line select signal FX<j> is enabled to the high voltage VPP, the sub word line SWL<k> may be enabled to the high voltage VPP. In the other cases, the sub word line SWL<k> may be disabled to the low voltage VBBW.

A plurality of sub word lines SWL<k> may be allocated to one main word line MWLB<i>. For example, eight sub word lines SWL<0:7> may be bound per one main word line MWB<i>. The sub word line SWL<k> may correspond to a word line WL which controls a cell transistor CTR of a memory cell MC.

The word line select signal FX<j> is a signal for selecting the sub word line SWL<k> which is to be enabled among the sub word lines SWL<k> allocated to the main word line MWLB<i>. For example, when total nine addresses are provided to select the sub word line SWL<k>, six addresses may be used to select the main word line MWLB<i> which is to be enabled among total 64($2^6$) main word lines MWLB<0:63>. Then, the rest three addresses may be used to select one of the eight sub word lines SWL<0:7> allocated to the enabled main word line MWLB<i>. At this time, the word line select signal FX<j> is used to select one of the eight sub word lines SWL<0:7>. That is, the word line select signal FX<j> may include address information for selecting one of the sub word lines SWL<k> allocated to the main word line MWLB<i>.

For reference, a unit memory cell MC of the semiconductor memory device may include one N-type cell transistor CTR and one cell capacitor CP. The unit memory cell MC may store data in a storage node SN coupled between the cell transistor CTR and the cell capacitor CP. The data stored in the storage node SN may be lost, because the cell capacitor CP is discharged to the ground voltage VSS when a predetermined time has elapsed. Thus, the cell capacitor CP needs to be periodically refreshed.

According to the above-described configuration, when the word line WL is enabled, the cell transistor CTR may be turned on to store data loaded in the bit line BL into the storage node SN (corresponding to a write operation), or turned on to transmit data stored in the storage node SN to the bit line BL (corresponding to a read operation).

Furthermore, a cell plate voltage VCP may be supplied to one node (i.e., a cell plate node) of the cell capacitor CP. At this time, the cell plate voltage VCP may be equal to a bit line precharge voltage VBLP, and serve to protect the dielectric of the cell capacitor CP.

Figure 2:
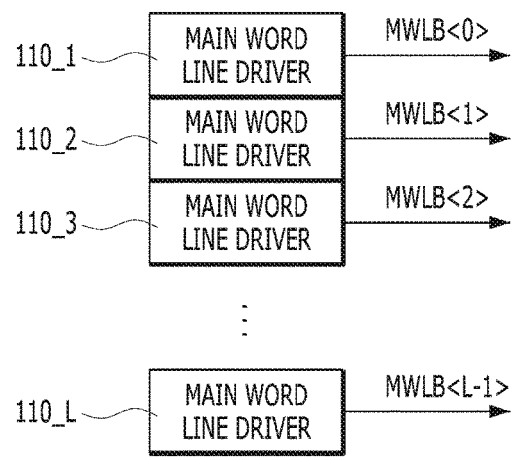
FIG. 2 is a block diagram illustrating a main word line driver of FIG. 1.

FIG. 2 is a block diagram illustrating the main word line driver 110 of FIG. 1.

Referring to FIG. 2, each of a plurality of main word line drivers 110_1, 110_2, 110_3, . . . , 110_L may correspond to the main word line driver 110 of FIG. 1. The semiconductor memory device may include L main word line drivers 110_1, 110_2, 110_3, . . . , 110_L, and the main word line drivers may drive the respective main word lines MWLB<0:L−1>.

Figure 3A:
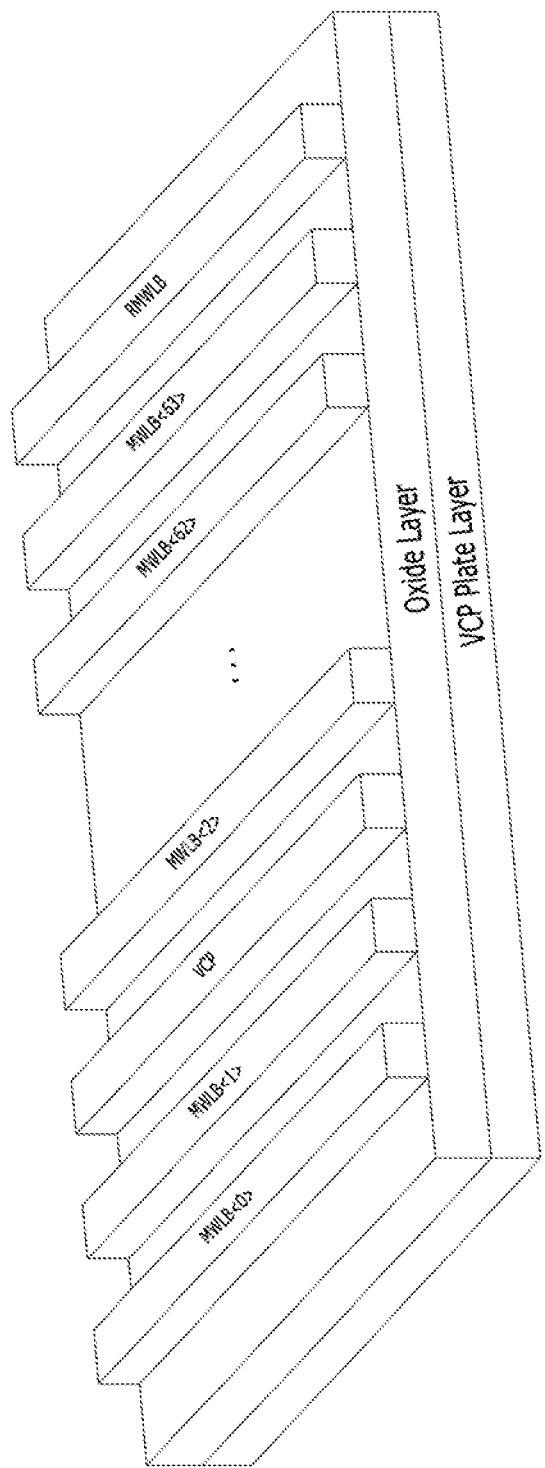
FIGS. 3A and 3B are perspective views of an arrangement of a VCP plate layer and main word lines of FIGS. 1 and 2.
Figure 3B:
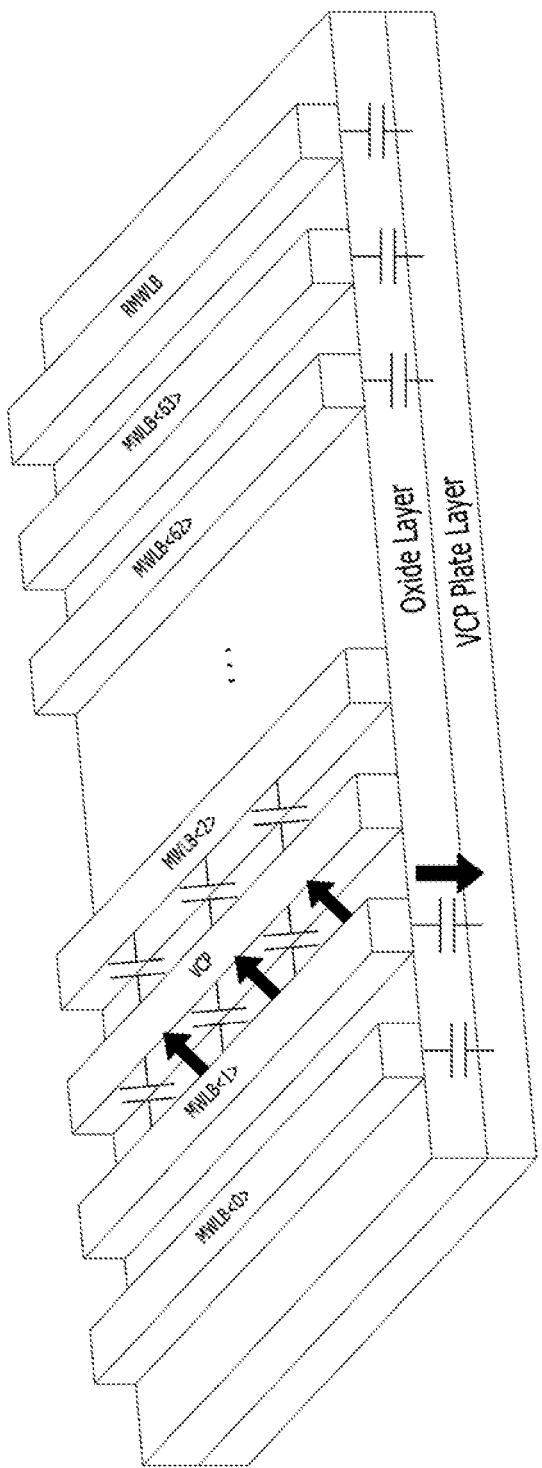

FIGS. 3A and 3B are perspective views of an arrangement of a VCP plate layer and the main word lines MWLB<0:L−1> of FIGS. 1 and 2. FIGS. 3A and 3B are used for describing noise introduction into the VCP plate layer from the main word lines MWLB<0:L−1>.

The semiconductor memory device requires operation voltages, such as, for example, an external supply voltage, a ground voltage, an internal supply voltage, a reference voltage, and a high voltage, in order to access data. The operation voltages may be transmitted to the cell area of the semiconductor memory device through power lines.

With the rapid increase in integration density and storage capacity of semiconductor memory devices, the number of signal lines has been increasing gradually. Thus, most signal lines may be arranged at a top layer of a substrate, and power lines for transmitting power may be distributed and arranged between the signal lines. At this time, power lines at the same level or height may be coupled to a bottom layer of the substrate through via contacts.

Referring to FIG. 3A, a VCP plate layer from which the cell plate voltage VCP is supplied to the cell plate node of the cell capacitor CP may be arranged over the substrate (not illustrated), an oxide layer forming the dielectric layer of the cell capacitor CP may be arranged over the VCP plate layer, and a plurality of main word lines MWLB<0:63> and a redundancy main word line RWLB may be arranged with a predetermined interval on the oxide layer. For example, a power line for supplying the cell plate voltage VCP may be arranged at every predetermined number of main word lines. Hereinafter the power line will be referred to as a 'VCR power line'. The VCP power line may be coupled to the VCP plate layer through a via contact (not illustrated). FIG. 3A illustrates one VCP power line. A larger number of VCP power lines may also be arranged. For example, when 64 main word lines MWLB<0:63> exist, six or seven VCP power lines may be arranged.

Referring to FIG. 3B, however, when a specific main word line among the whole main word lines MWLB<0:63> is activated, noise may be introduced into the VCP plate layer through the VCR power line, due to the coupling between the specific main word line and surrounding conductive lines that is, surrounding main word lines.

Hereinafter, a method for detecting and screening weak cells according to an embodiment of the present invention will be described. The method may increase the amount of noise introduced into the VCP plate layer through the VCP power line using a power scheme of the word line driving circuit during a test mode, for detecting and screening weak cells.

Figure 4:
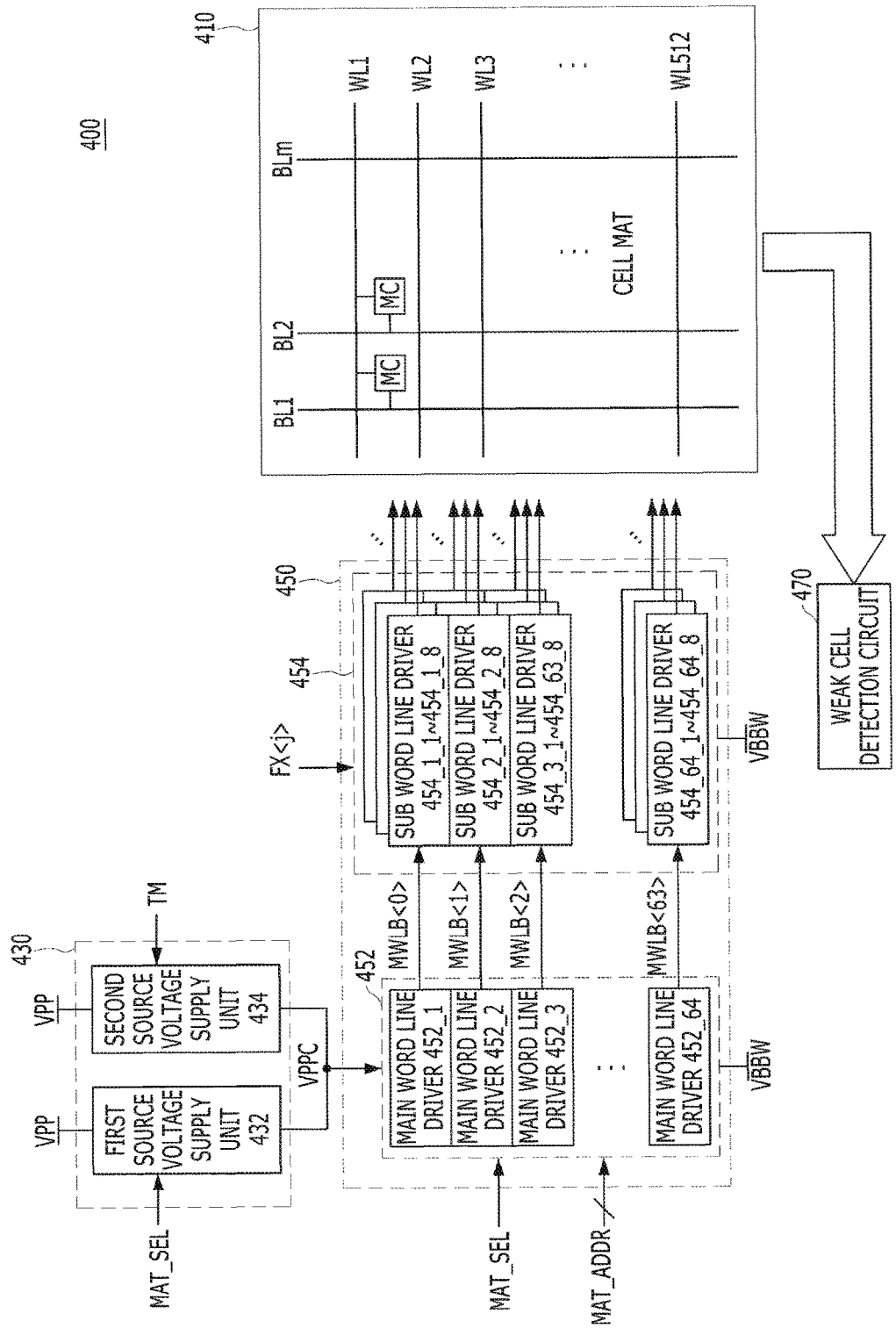
FIG. 4 is a block diagram illustrating a semiconductor memory device for detecting weak cells according to an embodiment of the present invention.

FIG. 4 is a block diagram illustrating a semiconductor memory device 400 for detecting weak cells, according to an embodiment of the present invention. For convenience of description, FIG. 4 illustrates an example in which one cell mat includes 512 word lines WL1 to WL512, that is, 64 main word lines MWLB<0:63> and eight sub word lines allocated to each main word line. For reference, the sub word lines may correspond to the actual word lines WL1 to WL512.

Referring to FIG. 4, the semiconductor memory device 400 may include a memory cell array 410, a source voltage supply unit 430, a word line driving circuit 450, and a weak cell detection circuit 470.

The memory cell array 410 may include a plurality of cell mats each including a plurality of memory cells MC coupled between the plurality of word lines WL1 to WL512 and a plurality of bit lines BL1 to BLm. FIG. 4 illustrates the case in which one cell mat forms the memory cell array 410, but the memory cell array may include a plurality of cell mats.

The source voltage supply unit 430 may supply a source voltage to a source voltage terminal VPPC. The source voltage supply unit 430 may provide a dropped voltage VDROP having a voltage level lower than that of a boosted voltage VPP to the source voltage terminal VPPC when a cell mat signal MAT_SEL is deactivated, that is, during a standby operation, and provide the boosted voltage VPP to the source voltage terminal VPPC when the cell match signal MAT_SEL is activated, that is, during an active operation. At this time, the source voltage supply unit 430 may supply the dropped voltage VDROP so that the dropped voltage VDROP during a test mode is lower than the dropped voltage VDROP during a normal mode. Thus, when the cell mat signal MAT_SEL transits to the active state from the inactive state, a voltage variation of the source voltage terminal VPPC during the test mode may be larger than a voltage variation of the source voltage terminal VPPC during the normal mode. As a result, the amount of noise, which is introduced into a cell plate node (not illustrated) of the memory cell array 410 from the plurality of word lines WL1 to WL512 may be increased during the test mode.

More specifically, the source voltage supply unit 430 may include first and second source voltage supply units 432 and 434.

The first source voltage supply unit 432 may provide the boosted voltage VPP to the source voltage terminal VPPC when the cell mat signal MAT_SEL is activated. The second source voltage supply unit 434 may provide the dropped voltage VDROP having a lower voltage level than the boosted voltage VPP to the source voltage terminal VPPC. At this time, the second source voltage supply unit 434 may supply the dropped voltage VDROP so that the dropped voltage VDROP during the test mode is lower than the dropped voltage VDROP during the normal mode. For example, the dropped voltage VDROP during the normal mode may have a voltage level lowered by a threshold voltage Vt of a diode from the boosted voltage VPP, that is, a voltage level of (VPP−Vt). The dropped voltage VDROP during the test mode may have a voltage level lowered by an integer multiple of the threshold voltage Vt of the diode from the boosted voltage VPP, that is, a voltage level of (VPP−N*Vt), wherein N is the number of the diodes.

The word line driving circuit 450 may be coupled between the source voltage terminal VPPC and a low voltage (VBBW) terminal. When the cell mat signal MAT_SEL is activated, the word line driving circuit 450 may select one of the plurality of word lines WL1 to WL512 in response to an address combination signal MAT_ADDR, and drive the selected word line and unselected word lines to a low voltage VBBW and the source voltage (i.e., the high voltage VPP or the dropped voltage VDROP) of the source voltage terminal VPPC. At this time, the high voltage VPP may be higher than a supply voltage VDD, and the low voltage VBBW may be equal to or lower than a ground voltage VSS.

More specifically, the word line driving circuit 450 may include a main word line driving unit 452 and a sub word line driving unit 454.

The main word line driving unit 452 may include a plurality of main word line drivers 452_1 to 452_64. When the cell mat signal MAT_SEL is activated, each of the main word line drivers 452_1 to 452_64 may drive the corresponding main word line MWLB<i> to the low voltage VBBW and the source voltage (i.e., the high voltage VPP or the dropped voltage VDROP) of the source voltage terminal VPPC in response to the address combination signal MAT_ADDR.

The sub word line driving unit 454 may include a plurality of sub word line drivers 454_1_1 to 454_1_8, . . . , 454_64_1 to 454_64_8. One main word line driver may include a plurality of sub word line drivers dependent thereon. FIG. 4 illustrates an example wherein eight sub word line drivers are allocated to each main word line driver. The sub word line drivers 454_1_1 to 454_18, . . . , 454_64_1 to 454_64_8 may be coupled to the plurality of word lines WL1 to WL512, respectively. Also, each of the sub word line drivers may drive the word line coupled thereto to the high voltage VPP or the low voltage VBBW in response to the corresponding main word line MWLB<i> and a word line select signal FX<j>. Only when the main word line MWLB<i> is enabled to the low voltage VBBW and the word line select signal FX<j> is enabled to the high voltage VPP, the word lines WL may be enabled to the high voltage VPP. In all other cases, the word lines WL may be disabled.

The weak cell detection circuit 470 may detect and screen weak cells by checking data values of the memory cells MC coupled to the plurality of word lines WL1 to WL512 which are driven by the word line driving circuit 450 during the test mode. At this time, when the cell mat signal MAT_SEL transits to the active state from the inactive state, the voltage variation of the source voltage terminal VPPC during the test mode may be larger than the voltage variation of the source voltage terminal VPPC during the normal mode. As a result, the amount of noise, which is introduced into the cell plate node (not illustrated) of the memory cell array 410 from the plurality of word lines WL1 to WL512, may be increased during the test mode. At this time, as the large amount of noise is introduced into weak cells, error data may be outputted from the weak cells which are not detected during a prior test mode. The weak cell detection circuit 470 may detect and screen weak cells which output error data during the test mode. In an embodiment the weak cell detection circuit 470 may include a comparison unit or comparing output data with reference data.

As described above, the semiconductor memory device according to an embodiment of the present invention may detect and screen weak cells which output error data, in a state where the voltage variation of the source supply terminal of the word line driving circuit is increased to increase the amount of noise introduced into the cell plate node of the memory cell array from the plurality of word lines, during the test mode. Thus, the semiconductor memory device may detect and screen weak cells without a separate driving circuit. Although a minimum of area is added, the weak cell screening operation may be performed more efficiently.

Figure 5:
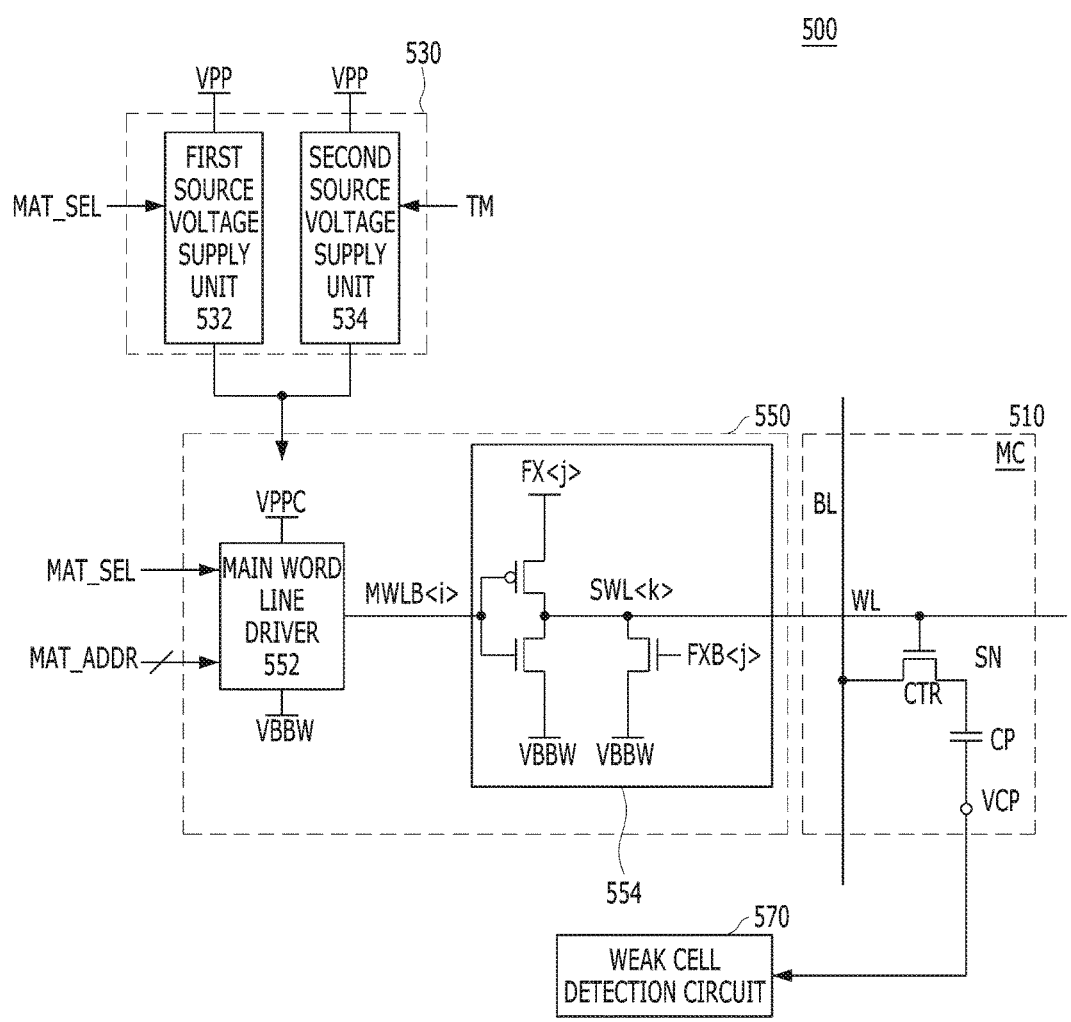
FIG. 5 is a block diagram illustrating a semiconductor memory device for detecting weak cells, according to an embodiment of the present invention.

FIG. 5 is a block diagram illustrating a semiconductor memory device 500 for detecting weak cells, according to an embodiment of the present invention. FIG. 5 illustrates a word line driving unit 550 corresponding to a unit memory cell (MC) 510 and components relating to the word line driving unit 550, in order to easily describe the configuration of FIG. 4.

According to the embodiment of FIG. 5 the semiconductor memory device 500 may include a unit memory cell 510, a source voltage supply unit 530, a word line driving unit 550, and a weak cell detection circuit 570.

The unit memory cell 510 may include an N-type cell transistor CTR and a cell capacitor CP. Data may be stored in a storage node SN coupled between the cell transistor CTR and the cell capacitor CP. Furthermore, one node of the cell capacitor CP may be coupled to a cell plate node for receiving a cell plate voltage VCP.

The source voltage supply unit 530 may supply a source voltage to a source voltage terminal VPPC. The source voltage supply unit 530 may provide a dropped voltage VDROP having a voltage level lower than that of a boosted voltage VPP to the source voltage terminal VPPC when a cell mat signal MAT_SEL is deactivated, that is, during a standby operation, and provide the boosted voltage VPP to the source voltage terminal VPPC when the cell match signal MAT_SEL is activated, that is, during an active operation. The word line driving unit 550 may be coupled between the source voltage terminal VPPC and a low voltage (VBBW) terminal, and drive a word line WL in response to the cell mat signal MAT_SEL and an address combination signal MAT_ADDR.

The source voltage supply unit 530 may provide the dropped voltage VDROP to the source voltage terminal VPPC so that the dropped voltage VDROP during a test mode is lower than the dropped voltage VDROP during a normal mode. Thus, when the cell mat signal MAT_SEL transits to the active state from the inactive state during the test mode, a voltage variation of the source voltage terminal VPPC may be larger than a voltage variation of the source voltage terminal VPPC during the normal mode. As a result, the amount of noise may be increased during the test mode, the noise being introduced into the cell plate node of the memory cell array 510 from the plurality of word lines. When the cell mat signal MAT_SEL transits to the active state from the inactive state during the test mode the weak cell detection circuit 570 illustrated in FIG. 5 may detect and screen weak cells by checking the cell plate voltages VCP of the cell plate nodes of the memory cells MC coupled to the word line WL which is driven by the word line driving unit 550.

More specifically, the source voltage supply unit 530 may include a first source voltage supply unit 532 and a second source voltage supply unit 534.

The first source voltage supply unit 532 may provide the boosted voltage VPP to the source voltage terminal VPPC when the cell mat signal MAT_SEL is activated. The second source voltage supply unit 534 may provide the dropped voltage VDROP that is lower than the boosted voltage VPP to the source voltage terminal VPPC. The second source voltage supply unit 534 may provide the dropped voltage VDROP so that the dropped voltage VDROP during the test mode is lower than the dropped voltage VDROP during the normal mode. For example, the dropped voltage VDROP during the normal mode may have a voltage level lowered by a threshold voltage Vt of a diode from the boosted voltage VPP, that is, a voltage level of (VPP−Vt), and the dropped voltage VDROP during the test mode may have a voltage level lowered by an integer multiple of the threshold voltage Vt of the diode from the boosted voltage VPP, that is, a voltage level of (VPP−N*Vt).

The word line driving unit 550 may be coupled between the source voltage terminal VPPC and the low voltage (VBBW) terminal. When the cell mat signal MAT_SEL is activated, the word line driving unit 550 may select one of the plurality of word lines in response to the address combination signal MAT_ADDR, and drive the selected word line and unselected word lines to a low voltage VBBW and the source voltage (i.e., the high voltage VPP and the dropped voltage VDROP) of the source voltage terminal VPPC. At this time, the high voltage VPP may be higher than a supply voltage VDD, and the low voltage VBBW may be equal to or lower than a ground voltage VSS.

More specifically, the word line driving unit 550 may include a main word line driver 552 and a sub word line driver 554. For reference, one main word line driver 552 may be coupled to a plurality of sub word line drivers 554. For convenience of description, however, FIG. 5 illustrates only one sub word line driver 554 corresponding to the unit memory cell 510.

When the cell mat signal MAT_SEL is activated, the main word line driver 552 may drive a main word line MWLB<i> to the low voltage VBBW and the source voltage (i.e., the high voltage VPP or the dropped voltage VDROP) of the source voltage terminal VPPC in response to the address combination signal MAT_ADDR. The sub word line driver 554 may be coupled to the word line WL of the unit memory cell 510, and drive the coupled word line WL to the high voltage VPP or the low voltage VBBW in response to the corresponding main word line MWLB<i> and the word line select signal FX<j>. Only when the main word line MWLB<i> is enabled to the low voltage VBBW and the word line select signal FX<j> is enabled to the high voltage VPP, the word line WL of the unit memory cell 510 may be enabled to the high voltage VPP. In the other cases, the word line WL of the unit memory cell 510 may be disabled.

As described above, the semiconductor memory device according to an embodiment of the present invention may detect and screen weak cells by checking the cell plate voltages VCP of the cell plate nodes of the memory cells MC coupled to the word line WL, in a state where the voltage variation of the source supply terminal of the word line driving circuit during the test mode is increased to increase the amount of noise introduced to the cell plate node of the memory cell array from the plurality of word lines. Thus, the semiconductor memory device may detect and screen weak cells without a separate driving circuit. Although a minimum of area is added, the weak cell screening operation may be performed more efficiently.

Figure 6:
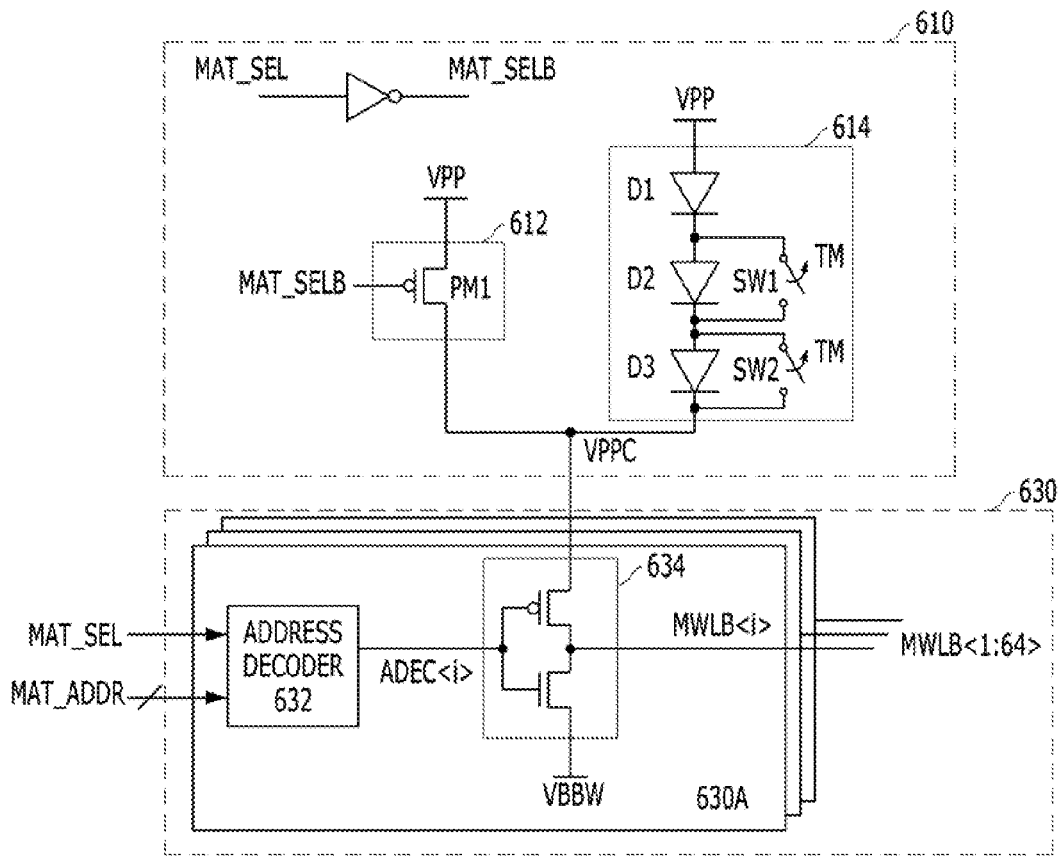
FIG. 6 is a detailed circuit diagram illustrating a source voltage supply unit and a main word line driving unit, according to an embodiment of the present invention.

FIG. 6 is a detailed circuit diagram illustrating a source voltage supply unit 610 and a main word line driving unit 630, according to an embodiment of the present invention.

According to the embodiment of FIG. 6, a first source voltage supply unit 612 of the source voltage supply unit 610 may include a PMOS transistor PM1 coupled between a boosted voltage (VPP) terminal and a source voltage terminal VPPC. The PMOS transistor PM1 may be turned on in response to an inverted signal MAT_SELB of a cell mat signal MAT_SEL. Furthermore, a second source voltage supply unit 614 of the source voltage supply unit 610 may include N diodes D1 to D3 coupled in series between the boosted voltage (VPP) terminal and the source voltage terminal VPPC and (N−1) switches SW1 and SW2 coupled in parallel to (N−1) diodes (for example, D2 and D3) among the N diodes D1 to D3. FIG. 6 illustrates an example wherein N is set to a value of 3 (N=3). However, we note that the number of diodes and the number of switches coupled in parallel to the diodes may be adjusted according to a target voltage. At this time, the switches SW1 and SW2 may be open by a test mode signal TM indicating the entry to a test mode. Thus, during a normal mode, the source voltage supply unit 610 may supply a dropped voltage VDROP to the source voltage terminal VPPC, the dropped voltage VDROP having a voltage level lowered by a threshold voltage Vt of a diode from the boosted voltage VPP, that is, a voltage level of (VPP−Vt). During the test mode, the source voltage supply unit 610 may supply a dropped voltage VDROP to the source voltage terminal VPPC, the dropped voltage VDROP having a voltage level lowered by an integer multiple of the threshold voltage Vt of the diode from the boosted voltage VPP, that is, a voltage level of (VPP−N*Vt).

The main word line driving unit 630 may include a plurality of main word line drivers 630A, each of which drives the corresponding main word line MWLB<i> to a low voltage VBBW and a source voltage (i.e., the high voltage VPP or the dropped voltage VDROP) of the source voltage terminal VPPC in response to the address combination signal MAT_ADDR, when the cell mat signal MAT_SEL is activated. All of the main word line drivers 630A may receive the source voltage through the common source supply terminal VPPC from the source voltage supply unit 610.

Each of the main word line drivers 630A may include an address decoder 632 and a driver 634. The address decoder 632 may generate a target address signal ADEC<i> by decoding the address combination signal MAT_ADDR, during an active operation in which the cell mat signal MAT_SEL is activated. At this time, the target address signal ADEC<i> may be activated to a high level, when a combination of predetermined addresses, that is, the address combination signal MAT_ADDR, indicate the corresponding main word line MWLB<i> during the active operation. For example, when 100 main word lines exist, only one target address signal ADEC<i> may be activated to a high level through decoding of the address combination signal MAT_ADDR, during the active operation. That is, when an address for selecting the third main word line MWLB<3> is inputted, the address decoder 632 may activate only the corresponding target address signal ADEC<3> during the active operation. The driver 634 may be coupled between the source supply terminal VPPC and a low voltage (VBBW) terminal, and drive the corresponding main word line MWLB<i> according to the target address signal ADEC<i>.

Hereinafter, referring to FIGS. 6 and 7, a method of detecting weak cells in a semiconductor memory device according to an embodiment of the present invention will be described.

Figure 7:
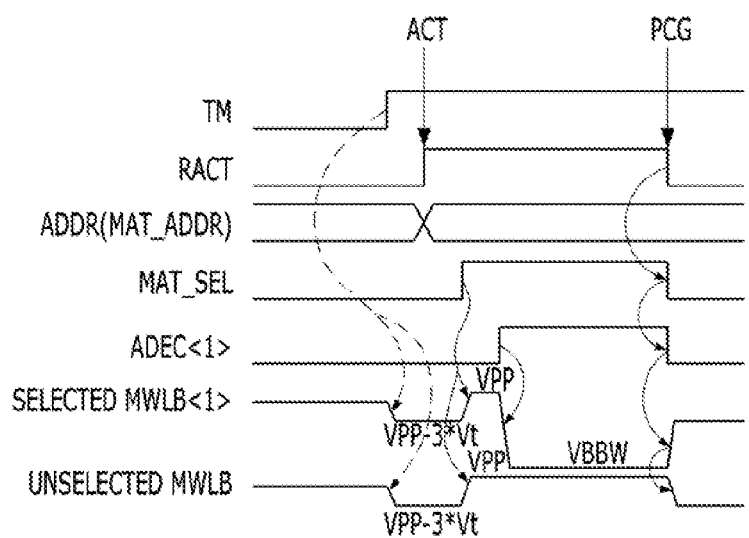
FIG. 7 is a timing diagram for describing a method of detecting weak cells in a semiconductor memory device, according to an embodiment of the present invention.
Figure 8:
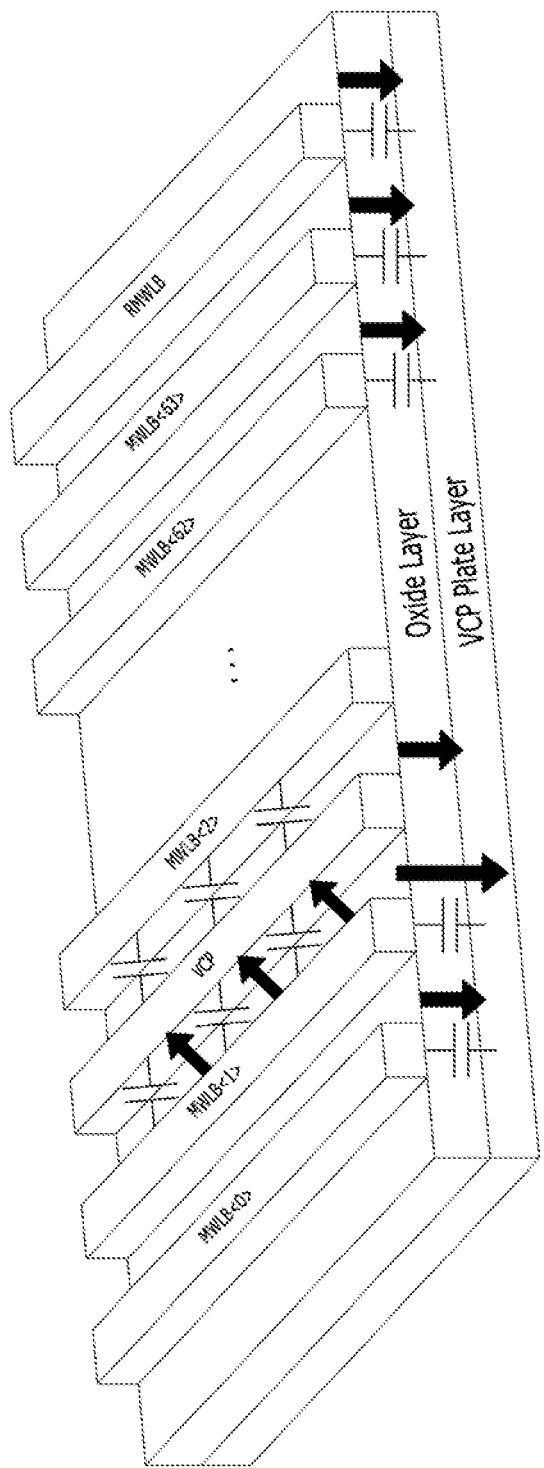
FIG. 8 is a perspective view for describing an introduction of noise into a VCP plate layer from a main word line, according to the embodiment of the present invention.

FIG. 7 is a timing diagram for describing a method of detecting weak cells in a semiconductor memory device, according to an embodiment of the present invention. FIG. 8 is a perspective view for describing noise introduced into the VCP plate layer from a main word line according to an embodiment of the present invention.

Hereinafter, for convenience of description, we suppose that a selected main word line is the second main word line MWLB<1>. In FIG. 7, a row active signal RACT represents a signal which is enabled when an active signal ACT is activated, and disabled when a precharge signal PCG is activated. When the active signal ACT is inputted, a row address ADDR for selecting a word line may be inputted together. For reference, the row address ADDR may include an address indicating the cell mat signal MAT_SEL for selecting a cell mat, an address indicating the address combination signal MAT_ADDR for selecting a main word line, and an address indicating the word line select signal FX<j> or selecting a sub word line.

Referring to FIG. 7, the test mode signal TM indicating the entry to the test mode may be activated, and the switches SW1 and SW2 of the second source voltage supply unit 614 of FIG. 6 may be open in response to the test mode signal TM.

During the standby operation in which the cell mat signal MAT_SEL is deactivated, the second source voltage supply unit 614 may supply the dropped voltage VDROP to the source supply terminal VPPC. At this time, during the test mode the switches SW1 and SW2 of the second source voltage supply unit 614 may be open, and the second source voltage supply unit 614 may supply the dropped voltage VDROP to the source supply terminal VPPC, the dropped voltage VDROP having a voltage level lowered by an integer multiple of the threshold voltage Vt of the diode from the boosted voltage VPP, that is, a voltage level of (VPP−3*Vt). Thus, all of the main word lines MWLB<0: M−1> may be driven to the dropped voltage VDROP having a voltage level of (VPP−3*Vt).

Then, during the active operation in which the cell mat signal MAT_SEL is activated according to the input row address ADDR, the first source voltage supply unit 612 of FIG. 6 may supply the boosted voltage VPP to the source supply terminal VPPC. Thus, all of the main word lines MWLB<0:M−1> may be driven to the boosted voltage VPP.

At this time, the address combination signal MAT_ADDR may be generated according to the input row address ADDR, and then decoded to activate the target address signal ADEC<1> for selecting the second main word line MWLB<1>. Thus, the selected main word line MWLB<1> may be driven to the low voltage VBBW according to the activated target address signal ADEC<1>, and the unselected main word lines may be continuously driven to the boosted voltages VPP. As a result, the selected main word line MWLB<1> may transit to the low voltage VBBW through the boosted voltage VPP from the dropped voltage VDROP having a voltage level of (VPP−3*Vt), and the unselected main word lines may transit to the boosted voltage VPP from the dropped voltage VDROP having a voltage level of (VPP−3*Vt).

At this time, although the unselected main word lines retain a logic high level, the high-level voltage may change to the boosted voltage VPP from the dropped voltage VDROP having a voltage level of (VPP−3*Vt). In particular, when the active signal ACT and the precharge signal PCG are repetitively inputted, the amount of noise may be increased, the noise being introduced into the VCP plate layer through a VCP power line from the main word lines as illustrated in FIG. 8.

At this time, as a large amount of noise is introduced into weak cells, error data may be outputted from the weak cells which are not detected during a prior test. The weak cell detection circuit 470 illustrated in FIG. 4 may detect and screen weak cells which output error data during the test mode. Alternatively, the weak cell detection circuit 570 illustrated in FIG. 5 may detect and screen weak cells by checking the cell plate voltages VCP of the cell plate nodes of the memory cells MC.

As described above, the semiconductor memory device, according to an embodiment of the present invention, may detect weak cells which output error data or detect and screen weak cells by checking the cell plate voltages VCP of the cell plate nodes of the memory cells MC, in a state where the voltage variation of the source voltage supply unit of the word line driving circuit is increase to raise the amount of noise introduced into the cell plate nodes of the memory cell array from the plurality of word lines, during the test mode. Thus, the semiconductor memory device can detect and screen weak cells without a separate driving circuit. As a result, although a minimum of area is added, the weak cell screening operation can be performed more efficiently.

Furthermore the semiconductor memory device, according to an embodiment of the present invention can screen weak cells using the existing power scheme of the word line driving circuit which supplies the boosted voltage to the word line driving circuit during the active operation in which the cell mat signal is activated and supplies a voltage lower than the boosted voltage during the standby operation in which the cell mat signal is deactivated. Thus, the semiconductor memory device can detect and screen weak cells while reducing leakage current, or particularly GIDL (Gate Induced Drain Leakage).

Although various embodiments have been described for illustrative purposes, it will be apparent to those skilled in the art that various changes and modifications may be made without departing from the spirit and/or scope of the invention as defined in the following claims.

For example, the positions and types of the logic gates and transistors used in the above-described embodiments may be set in different manners according to the polarities of input signals.

What is claimed is:

1. A semiconductor memory device comprising:
   a memory cell array coupled between a plurality of word lines and a plurality of bit lines;
   a first source voltage supply unit suitable for providing a boosted voltage to a source voltage terminal when a cell mat signal is activated;
   a second source voltage supply unit suitable for providing a dropped voltage that is lower than the boosted voltage to the source voltage terminal, wherein the dropped voltage during a test mode is lower than the dropped voltage during a normal mode, and the dropped voltage has a voltage level lowered by a threshold voltage of a diode from the boosted voltage during the normal mode, and the dropped voltage has a voltage level lowered by an integer multiple of the threshold voltage of the diode from the boosted voltage during the test mode;
   a word line driving circuit coupled between the source voltage terminal and a low voltage terminal, and suitable for selecting one of the plurality of word lines in response to an address combination signal and driving the selected word line and unselected word lines, when the cell mat signal is activated; and
   a weak cell detection circuit suitable for detecting a weak cell by checking data values of memory cells coupled to a word line which is driven by the word line driving circuit during the test mode.

2. The semiconductor memory device of claim 1, wherein, when the cell mat signal transits to an active state from an inactive state, a voltage variation of the source voltage terminal during the test mode becomes larger than a voltage variation of the source voltage terminal during the normal mode, and an amount of noise introduced to a cell plate node of the memory cell array from the plurality of word lines is increased.

3. The semiconductor memory device of claim 1, wherein the selected word line is driven from the dropped voltage through the boosted voltage to a low voltage, and the unselected word lines are driven from the dropped voltage to the boosted voltage.

4. The semiconductor memory device of claim 1, wherein the second source voltage supply unit comprises:
   N diodes coupled in series between a boosted voltage terminal and the source voltage terminal; and
   (N−1) switches coupled in parallel to (N−1) diodes among the N diodes, the switches being open by a test mode signal.

5. A semiconductor memory device comprising:
   a memory cell array coupled between a plurality of word lines and a plurality of bit lines, and coupled to a cell plate node;
   a source voltage supply unit suitable for supply a source voltage to a source voltage terminal by providing a dropped voltage that is lower than a boosted voltage to the source voltage terminal when a cell mat signal is deactivated, and by providing the boosted voltage to the source voltage terminal when the cell mat signal is activated;
   a word line driving circuit coupled between the source voltage terminal and a low voltage terminal, and suitable for driving the plurality of word lines in response to the cell mat signal and an address combination signal; and
   a weak cell detection circuit suitable for detecting a weak cell by checking a cell plate voltage of the cell plate node during a test mode,
   wherein the dropped voltage during the test mode is lower than the dropped voltage during a normal mode, and an amount of noise introduced into the cell plate node from the plurality of word lines is increased when the cell match signal transits from an inactive state to an active state,
   wherein the dropped voltage has a voltage level lowered by a threshold voltage of a diode from the boosted voltage during the normal mode, and the dropped voltage has a voltage level lowered by an integer multiple of the threshold voltage of the diode from the boosted voltage during the test mode.

6. The semiconductor memory device of claim 5, wherein the word line driving circuit comprises:
   a main word line driving circuit suitable for driving a plurality of main word lines to the source voltage or a low voltage, in response to the cell mat signal and the address combination signal; and
   a sub word line driving circuit suitable for selecting one of the plurality of word lines in response to the main word lines and a word line select signal obtained by decoding the address combination signal, and driving the selected word line and unselected word lines.

7. The semiconductor memory device of claim 5, wherein the source voltage supply unit comprises:

a first source voltage supply unit suitable for providing the boosted voltage to the source voltage terminal when the cell mat signal is activated; and
a second source voltage supply unit suitable for providing the dropped voltage that is lower than the boosted voltage to the source voltage terminal so that the dropped voltage during the test mode is lower than the dropped voltage during the normal mode.

8. The semiconductor memory device of claim 7, wherein the second source voltage supply unit comprises:
   N diodes coupled in series between a boosted voltage terminal and the source voltage terminal; and
   (N−1) switches coupled in parallel to (N−1) diodes among the N diodes, the switches being open by a test mode signal.

9. A method of detecting weak cells in a semiconductor memory device, the method comprising:
   entering a test mode;
   providing a dropped voltage that is lower than a boosted voltage to a source voltage terminal when a cell mat signal is deactivated, wherein the dropped voltage during a test mode is lower than the dropped voltage during a normal mode, and the dropped voltage has a voltage level lowered by a threshold voltage of a diode from the boosted voltage during the normal mode, and the dropped voltage has a voltage level lowered by an integer multiple of the threshold voltage of the diode from the boosted voltage during the test mode;
   selecting one of a plurality of word lines in response to an address combination signal, and driving the selected word line and unselected word lines, when the cell mat signal is activated; and
   detecting a weak cell by checking data values of memory cells coupled to the word lines.

10. The method of claim 9, wherein, when the cell mat signal transits from an inactive state to an active state, a voltage variation of the source voltage terminal during the test mode becomes larger than a voltage variation of the source voltage terminal during the normal mode, and an amount of noise introduced to a cell plate node of the memory cell array from the plurality of word lines is increased.

11. The method of claim 9, wherein the driving of the selected word line and the unselected word lines comprises:
   driving the selected word line from the dropped voltage through the boosted voltage to a low voltage; and
   driving the unselected word lines from the dropped voltage to the boosted voltage.

12. The method of claim 9, wherein the detecting of the weak cell comprises:
   detecting the weak cell by checking a cell plate voltage of the cell plate node.

* * * * *